(12) United States Patent
Arnal

(10) Patent No.: US 8,738,885 B2
(45) Date of Patent: May 27, 2014

(54) METHOD OF SELECTION OF AN AVAILABLE MEMORY SIZE OF A CIRCUIT INCLUDING AT LEAST PROCESSOR AND A MEMORY AND CORRESPONDING PROGRAM AND SMART CARD

(75) Inventor: Benoit Arnal, Meudon (FR)

(73) Assignee: Gemalto SA, Meudon (FR)

( * ) Notice: Subject to any disclaimer, the term of this patent is extended or adjusted under 35 U.S.C. 154(b) by 263 days.

(21) Appl. No.: 13/202,981

(22) PCT Filed: Feb. 9, 2010

(86) PCT No.: PCT/EP2010/051540
§ 371 (c)(1),
(2), (4) Date: Aug. 23, 2011

(87) PCT Pub. No.: WO2010/094592
PCT Pub. Date: Aug. 26, 2010

(65) Prior Publication Data
US 2011/0314249 A1    Dec. 22, 2011

(30) Foreign Application Priority Data
Feb. 23, 2009  (EP) .................................... 09305171

(51) Int. Cl.
*G06F 12/06*        (2006.01)
(52) U.S. Cl.
USPC ................... 711/172; 711/170; 711/E12.002; 711/E12.078
(58) Field of Classification Search
USPC .................. 711/172, 170, E12.002, E12.078
See application file for complete search history.

(56) References Cited

U.S. PATENT DOCUMENTS

| | | |
|---|---|---|
| 5,353,431 A | 10/1994 | Doyle et al. |
| 2002/0073292 A1* | 6/2002 | Murayama et al. ........... 711/170 |
| 2005/0278439 A1* | 12/2005 | Cherkasova .................. 709/223 |
| 2007/0011395 A1 | 1/2007 | Kim |

FOREIGN PATENT DOCUMENTS

EP         1906312 A1      4/2008

OTHER PUBLICATIONS

Anonymous: "Verigy IntaPin (Product Overview—5989-2597EN)" Internet Article, [Online] Jun. 1, 2006, pp. 1-4, XP002530937, Retrieved from the Internet: URL: http://www.verigy.com/content/dav/verigy/Internet/Products/V93000 SOC Series/Licensing/InstaPin HW Licensing/V5989-2597EN.pdf> [retrieved Apr. 14, 2010] whole document.

(Continued)

*Primary Examiner* — Yong Choe
(74) *Attorney, Agent, or Firm* — The Jansson Firm; Pehr B. Jansson

(57) ABSTRACT

The invention relates to a method for selecting an available memory size of a circuit including at least a CPU and a total memory, the method includes a stage for the selection of an available memory size that is smaller than or equal to that of the total memory. The selection stage is implemented by the manufacturer of the product incorporating the said circuit, different from the circuit manufacturer, and includes a stage for the generation of a configuration signature intended for the circuit manufacturer, which information is representative of the size of available memory size selected in this way by the product manufacturer.

8 Claims, 2 Drawing Sheets

(56) References Cited

OTHER PUBLICATIONS

Anonymous: "Verigy V93000 Pin Scale 800 digital card (Product Overview—5989-2596EN)" Internet Artice, [Online] (Jun. 1, 2006), pp. 1-4, XP002530938 http://www.verigy.com/content/dav/verigy/Internet/Products/V93000 SOC Series/Digital Pins/Pin Scale 800 Digital Card/V5989-2596EN.pdf.

Anonymous: "FlexNet Licensing End User Guide (Version 11.3, Document Revision 01)" Internet Article—Macrovision, [Online] (Jun. 30, 2006), pp. 1-40, XP002531465 Retrieved from the Internet: URL:http://www.vrcontext.com/download/customerhelp/FlexNetLicensingEndUserGuide.pdf> whole document.

PCT/EP2010/051540 International Search Report, Apr. 19, 2010, European Patent Office, P.B. 5818 Patentlaan 2 NL—2290 HV Rijswijk.

* cited by examiner

*PRIOR ART*

METHOD OF SELECTION OF AN AVAILABLE MEMORY SIZE OF A CIRCUIT INCLUDING AT LEAST PROCESSOR AND A MEMORY AND CORRESPONDING PROGRAM AND SMART CARD

BACKGROUND OF THE INVENTION

This invention relates to a method for the selection of an available memory size of a circuit including at least a processor (for example a CPU, a microprocessor or a processing unit) and a memory.

This invention will be described here in the context of the manufacturing of a particular product, the smart card, but it may be applied to other products incorporating an electronic circuit, such as an integrated circuit, including a processor and a total memory. In this same example, a non volatile memory (NVM) may be mentioned, but the invention applies to all types of memory (NVM, RAM etc.)

FIG. 1 illustrates three suppliers of integrated circuits according to the earlier technique, X1, X2 and X3, supplying products to a smart card manufacturer. Each supplier has several products. In practice, however, the different products have the same processor and are only differentiated by different available memories in each product. That is the case, for example, in this FIG. 1, with supplier X1, and product numbers 300K, 320K, 340K and 360K. These products 300K, 320K, 340K and 360K each have the same processor but different available memory sizes, namely 300 Kbytes, 320 Kbytes, 340 Kbytes and 360 Kbytes respectively.

Further, in reality, the products have the same total memory size of 360 Kbytes, but in an ultimate stage of manufacturing/testing the circuit, the circuit manufacturer has elected to make only part of the memory available for addressing a specific need of its customers. In such a case, the circuit manufacturer "blocks" and makes inaccessible (and does not for instance test) that portion of the memory that is not made available and defined in this particular case by a memory size that is equal to the difference between (a)—360 Kbytes and (b)—the size of the memory made available.

The problem with this solution according to the earlier technique is as follows:

the selection by the circuit manufacturer of an available memory size for each circuit makes it necessary for the circuit manufacturer to implement elaborate personalisation stages (different tests, different production lines) while manufacturing the circuit, making the process more complex.

SUMMARY OF THE INVENTION

The invention is aimed at remedying the problems. To that end, a method for selecting an available memory size has been devised for a circuit comprising at least a processor and a total memory. The method includes a stage involving the selection of an available memory size that is smaller than or equal to the total memory. In the invention, the selection stage is implemented by a manufacturer of a product incorporating the said circuit, different from the circuit manufacturer, and a stage involving the transmission via a communication network to a piece of equipment, for example a server, accessible by the circuit manufacturer, of information representing the available memory size selected in this way by the product manufacturer.

The invention also offers the benefit of remedying the major difference between customers' needs as perceived by the circuit supplier and the reality, and thus makes it easier for the circuit supplier, and possibly also the buyer of the circuits, to manage their inventory.

The invention is thus a method for configuring an available memory size of an integrated circuit with at least a processor and a total memory. The method comprises a stage for the configuration of an available memory size that is smaller than or equal to the total memory. The configuration stage is carried out by a circuit user, different from the circuit manufacturer. That configuration stage includes a stage for the selection of the memory size of the integrated circuit; a stage for registering and locking the selected memory size, such registration being locked permanently; and a stage for the generation by the integrated circuit of a signature representative of the selected memory size.

Advantageously, the configuration stage may involve a transmission stage for sending the said signature through a communications network to a piece of equipment of the circuit manufacturer.

In respect of another aspect, the invention is an integrated circuit comprising a total memory that is configurable so as to have an available memory that is smaller than the total memory. The integrated circuit comprises at least one memory zone to indelibly store a piece of setting up information, to define the configuration size of the memory, and a means to generate a signature representative of the configuration of the memory size.

On a preferential basis, the integrated circuit may comprise a communication interface capable of transmitting the signature. The integrated circuit may include blocking/unblocking means that block the normal working of the integrated circuit till an unblocking command is sent in response to the sending of the signature.

The invention also relates to a smart card with an integrated circuit as previously defined.

BRIEF DESCRIPTION OF THE DRAWINGS

Other characteristics and advantages of this invention will become clearer in the description below, to be read in relation with the corresponding drawings attached, where.

DETAILED DESCRIPTION OF THE INVENTION

Figure 1:
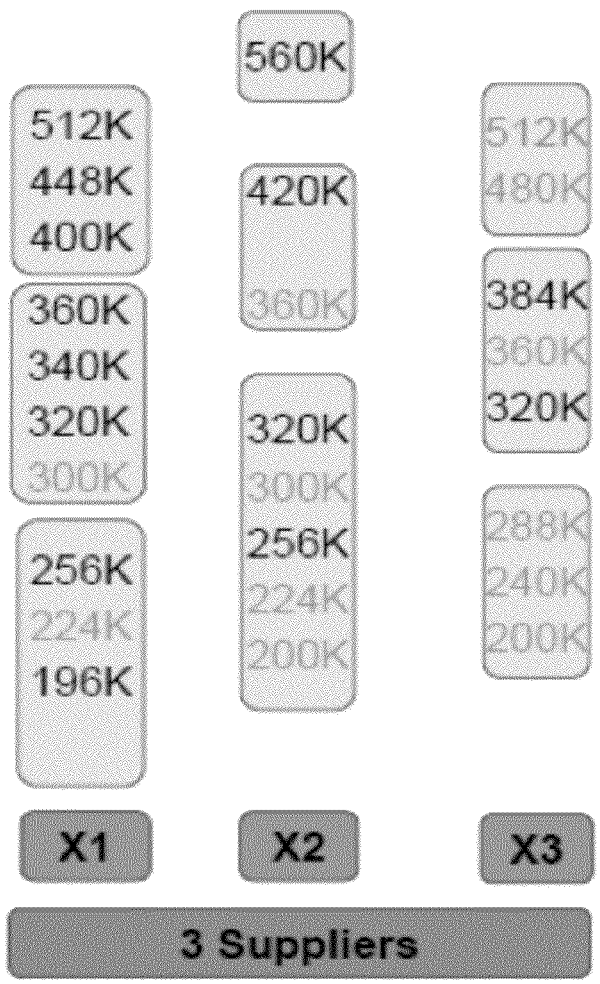
FIG. 1, discussed hereinabove, is an illustration of the circuits manufactured by three suppliers, the circuits of each supplier being grouped in the figure by processor identity.
Figure 2:
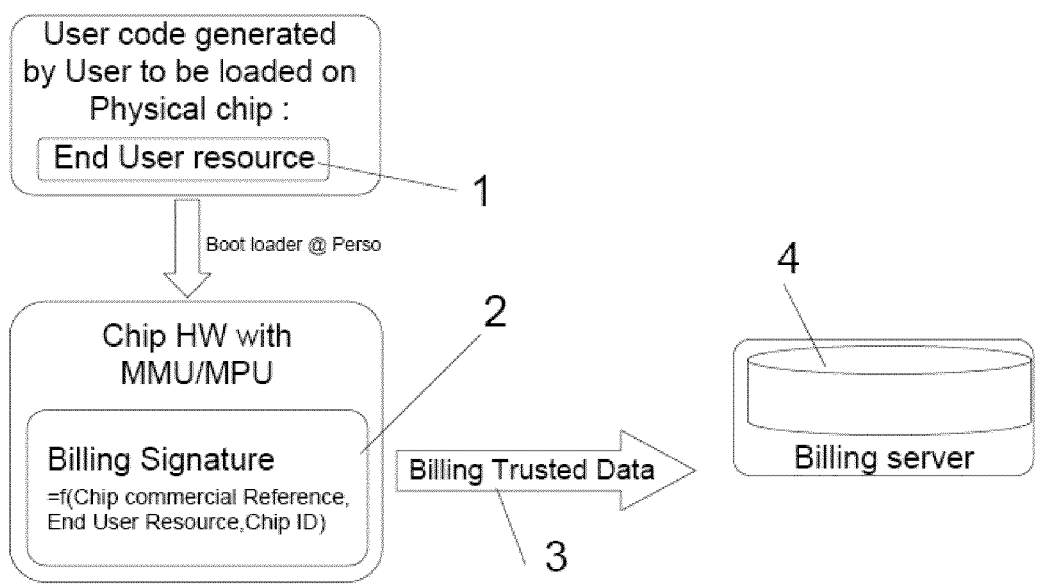
FIG. 2 is a block diagram of the elements for the implementation of the method according to the invention.

By reference to FIG. 2, according to the invention, the use of a development tool supplied by the circuit manufacturer is proposed. To return to the example in FIG. 1, according to the invention, the supplier will supply its customer, for any given processor, undifferentiated circuits with an identical processor and a total memory of 360 Kb (unlike circuits with the same processor and different available memory sizes, namely 300 Kbytes, 320 Kbytes, 340 Kbytes and 360 Kbytes respectively, with the same total memory size, according to the earlier technique).

The development tool supplied by the circuit supplier is used by its customer, the product manufacturer, to select an available memory size that is smaller than or equal to that of the total memory. Indeed, it is proposed that the circuits supplied are initially in a "blocked" state and the development tool is required to unblock the circuit through the selection of the memory size. The development tool asks the product manufacturer to enter/send to the undifferentiated circuit information about the required available memory size. For example, the following data are sent to the circuit:

Start address, end address and possibly

Configuration parameters for a memory management unit (MMU) in the circuit.

The Start address and End address data define a selected available memory size in the circuit, for example 300 Kbytes, or another size, smaller than or equal to 360 Kbytes (size of the total memory of the circuit in question).

A boot loader, which is also supplied by the circuit supplier, loads the data into the circuit to configure the circuit. Depending on the data, the circuit memory management unit particularly locks the read and/or write accessibility to only that zone of the available memory out of the total memory with a size matching the selected size. That stage, where a circuit memory management unit locks the read and/or write accessibility to the available memory zone out of the total memory, with a size that matches the selected size, is important to allow the circuit supplier to limit the use of the memory to only the available memory size. A memory management unit takes charge of managing the memory, the abstraction of addressing (conversion of logical addresses into physical addresses). However, there are a number of specific implementations. The memory management unit is nevertheless adapted to include a function for denying read/write access to any address that does not belong to all the addresses of the available memory size defined by the product supplier.

That information for setting up the selected memory size, "Start address, End address" may optionally be stored indelibly and clearly in the circuit in the OTP (One Time Programming) memory.

From this information for setting up the selected memory, a security signature 2 is also calculated on the basis of the information "Start address, End address", but also typically from a circuit serial number and possibly also an identifier of the commercial part number of the circuit.

The information including the "Start address", "End address", "Circuit serial number" and the associated signature is then sent via a communication network to a server 4, accessible by the circuit manufacturer.

In that way, information representing the available memory size thus selected by the product manufacturer is sent to the circuit supplier identified by its serial number, particularly for the purpose of charging the price. Such transmission may be done at any time, particularly during product manufacturing. A return receipt by the server 4 may also constitute a condition for allowing the overall working of the circuit, with only the elementary functions of reporting the aforementioned information to the server 4 being allowed prior to the return receipt.

The invention claimed is:

1. A method for configuring an available memory size of an integrated circuit comprising at least a processor and a total memory, the method comprising:

a configuration stage for the configuration of an available memory size smaller than or equal to that of the total memory, wherein the configuration stage is carried out by a circuit user other than the circuit manufacturer, and in that the configuration stage includes:

a stage for selecting the available memory size of the integrated circuit, a stage for registering and locking the selected available memory size, where such registration is locked permanently, and a stage for the generation by the integrated circuit of a signature representative of the selected available memory size.

2. The method of configuration according to claim 1 where the configuration stage further comprises a transmission stage where the signature is transmitted via a communications network to a piece of equipment of a circuit manufacturer.

3. An integrated circuit comprising:

a total memory that is configurable so as to obtain an available memory with a size smaller than the total memory, wherein the total memory comprises:

at least one memory zone to indelibly store setting up information that defines the configuration size of the available memory, and means to generate a signature representative of the configuration of the available memory size.

4. An integrated circuit according to claim 3, further comprising a communication interface capable of transmitting the signature.

5. An integrated circuit according to claim 4, further comprising a blocking/unblocking means that blocks normal operation of the integrated circuit until an unblocking command is sent back in response to the sending of the signature.

6. A smart card comprising:

an integrated circuit having:

a total memory that is configurable so as to obtain an available memory with a size smaller than the total memory, wherein the total memory comprises:

at least one memory zone to indelibly store setting up information that defines the configuration size of the available memory, and means to generate a signature representative of the configuration of the available memory size.

7. The smart card of claim 6 wherein the integrated circuit further comprises a communication interface capable of transmitting the signature.

8. The smart card of claim 7 wherein the integrated circuit further comprises a blocking/unblocking means that blocks normal operation of the integrated circuit until an unblocking command is sent back in response to the sending of the signature.

* * * * *